United States Patent [19]

Ricard

[11] Patent Number: 4,565,600

[45] Date of Patent: Jan. 21, 1986

[54] PROCESSES FOR THE CONTINUOUS PREPARATION OF SINGLE CRYSTALS

[75] Inventor: Jean Ricard, Grenoble, France

[73] Assignee: Criceram, Paris, France

[21] Appl. No.: 492,368

[22] Filed: May 11, 1983

Related U.S. Application Data

[63] Continuation of Ser. No. 257,968, Apr. 27, 1981, abandoned, and a continuation of Ser. No. 764,641, Feb. 1, 1977, abandoned, which is a continuation of Ser. No. 712,706, Aug. 9, 1976, abandoned.

[51] Int. Cl.⁴ .............................................. C30B 15/34
[52] U.S. Cl. ............................ 156/608; 156/DIG. 96
[58] Field of Search ............ 156/608, 617 SP, 617 V, 156/DIG. 96, DIG. 88; 169/60

[56] References Cited

U.S. PATENT DOCUMENTS

| | | | |
|---|---|---|---|
| 2,876,147 | 3/1959 | Kniepkemp | 156/617 SP |
| 3,393,054 | 7/1968 | Rupprecht et al. | 156/DIG. 96 |
| 3,755,011 | 8/1973 | Kleinknecht | 156/608 |
| 3,915,662 | 10/1975 | LaBelle | 156/617 SP |
| 4,022,652 | 5/1977 | Hirano et al. | 156/608 |
| 4,108,714 | 8/1978 | Keller et al. | 156/608 |

FOREIGN PATENT DOCUMENTS

13568 2/1976 Japan .

OTHER PUBLICATIONS

LaBelle, Mat. Res. Bull., vol. 6, #7, pp. 581–590, 1971.

*Primary Examiner*—Hiram H. Bernstein
*Attorney, Agent, or Firm*—Oblon, Fisher, Spivak, McClelland & Maier

[57] ABSTRACT

Processes for the continuous preparation of single crystals having a predetermined shape and requiring little or no subsequent machining which processes comprise placing a single crystal-forming material in a crucible fitted in its lower portion with a capillary conduit having a length equal to or greater than the retention length of the molten material in the capillary at the selected temperature and pressure, heating the crystal-forming material to a temperature above its melting point, bringing a performed appropriately oriented crystal seed into contact with the pendant drop formed at the lower point of the capillary, and pulling the seed crystal away from the feed material in the crucible so that the amount of crystal-forming material fed per unit of time is at every instant substantially equal to the quantity of material pulled into single crystal form, together with novel apparatus comprising a capillary-containing crucible, heating means, feed means, enclosure, seed-supporting carrier, means for moving and rotating the carrier, and means for controlling the movement of the carrier.

17 Claims, 13 Drawing Figures

PROCESSES FOR THE CONTINUOUS PREPARATION OF SINGLE CRYSTALS

This application is a continuation of application Ser. No. 257,968, filed Apr. 27, 1981, now abandoned, and a continuation of copending prior application Ser. No. 764,641, filed Feb. 1, 1977, now abandoned, which application was a continuation-in-part of application Ser. No. 712,706, filed Aug. 9, 1976, and now abandoned.

BACKGROUND OF THE INVENTION

The present invention relates to processes and apparatus for the continuous preparation of preshaped single crystals, and more particularly, this invention relates to methods for the preparation of preshaped single crystals through the use of a crucible provided with a pendant drop capillary, so that little or no machining of the single crystals produced is required.

There are a number of methods for preparing single crystals, notably the Verneuil process and its modifications, which are described for example in the article by F. A. Halden and R. Sedlacek entitled "Verneuil Crystal Growth in the Arc-Image Furnace" published in *Review of Scientific Instruments* 34(6) (June 1963); the Czochralski method described in the R. A. Laudise contribution *The Growth of Single Crystals,* published in the Solid State Physical Electronic Series, Prentice Hall, New York, 1970, edited by Nick Holonyack, Jr. The Czochralski-type processes involve vertically pulling a crystal starting from a molten bath by means of a single seed crystal turning around itself.

These processes lead to single crystals having bulky geometric shapes such as cylinders or cones, requiring considerable and delicate machine-finishing to obtain single crystals in a useful form, usually a thin slice. Moreover, these processes require a hiatus in the procedure every time the available liquid in the crucible is exhausted.

What is more, these prior art processes require crystallization vessels of very considerable size, on the order of several liters, and this constitutes a major drawback because the vessels are fabricated from rare metals, such as iridium, and are expensive. In use, these containers have a limited life of only a few crystallizations because of the chemical and thermal corrosion to which they are subjected, and this considerably increases the cost of producing such single crystals.

THE INVENTION

The present invention provides methods for preparing single crystals which require little or no machine-finishing; it moreover provides a continuous process for preparing single crystals; and it further provides processes for the preparation of single crystals which require only the use of crystallization vessels having a very small size. Other advantages of the processes and apparatus will be described and become apparent hereinafter.

Briefly, the present processes for preparing preshaped single crystals comprise:

(a) placing the single crystal-forming material into a crucible having in its lower portion a capillary aperture with a height equal to or greater than the retention height of the molten material in the capillary at the working temperature and pressure used, (b) bringing the material to a temperature above its melting point, (c) bringing a preshaped crystalline seed appropriately oriented into contact with the pendant drop formed at the lower extremity of the capillary orifice, (d) drawing the seed towards the bottom away from the feed material in the crucible so that the quantity of material fed per unit of time is at every instant substantially equal to the amount of material drawn into single crystal form and, (e) removing at selected time intervals the single crystals so formed. The invention also provides variations in the capillary and processes and apparatus for producing single crystals of controlled variable composition.

The invention is further described with reference to the accompanying drawings, wherein.

Figure 1:
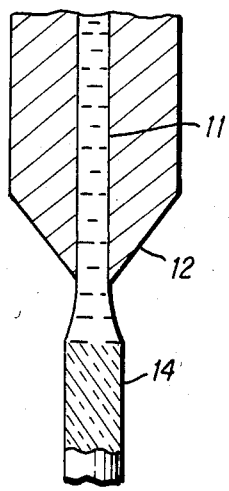
FIG. 1 is a view, partly in section, of the capillary mouth in one embodiment of the invention.

It will be understood from the present description that the processes and apparatus of the invention use the property, possessed by capillary tubes and plates open at their two extreme ends, of retaining liquids with the formation of a pendant or hanging drop at their lower end or mouth. It is in effet known that a liquid introduced into a capillary tube or plate, open at the two extremities, flows in the form of drops up to the point where the liquid reaches a certain length, h, with the formation of a pendant drop at the lower end of the capillary.

At a fixed temperature and pressure, an equilibrium is obtained such that small blows or shocks administered to the capillary cause small alterations in the drop volume, which alterations are compensated by opposite variations in the volume of the liquid retained in the interior of the capillary. The length, h, is given by Formula (I) for a capillary with a circular section:

$$h = \frac{2A(1 + K_R)}{R\rho g}, \qquad (I)$$

where

A is the surface tension of the liquid at the given temperature, $\rho$ is the liquid density at the given temperature, g is the acceleration of gravity, R is the interior radius of the capillary tube, and $K_R$ is a constant which depends upon the nature of the liquid and the shape of the end of the capillary tube.

For a capillary having a rectangular section, the length, h, is given by Formula (II):

$$h = \frac{2A(1 + K_e)}{epg},\qquad (II)$$

where
A, ρ, and g have the aforesaid meaning,
e is the capillary channel rectangular width, and
$K_e$ is a constant which depends upon the nature of the liquid and the shape of the end of the capillary.

The material used to prepare the single crystals can be fed in any appropriate form, for instance, as small beads or spheres, granules, or fine powder. The particle size is desirably from about one micron (micrometer) to about 2 mm.

The process can be carried out under an appropriate atmosphere depending on the chemical nature of the crystal and of the crucible material. Thus, the present processes can be carried out under an inert gas or oxygen-free gas such as nitrogen or argon, of they can be carried out entirely in air.

The working pressure can vary over a wide range. It can be atmospheric or subatmospheric pressure. If it is necessary, the processes and apparatus of this invention can be used under a vacuum reaching $10^{-5}$ mm Hg.

The temperature to which the crystal feedstock is brought is desirably sufficiently above the melting point of the crystal material so that the material is entirely molten. Thus, for sodium chloride (m.p.=800° C.), a temperature of 825° C. would be used; for silicon (m.p.=1410° C.), 1440° C.; and for alumina (m.p.=2050° C.), 2075° C. It is desirable in carrying out the process that the temperature be held to within about ±10° C. of the selected value. This affords another appreciable advantage of this invention over the prior art methods which required temperature regulation to ±0.5° C., because such close regulation is very difficult in the temperature ranges employed.

The speed at which the seed crystal is pulled downwardly can be varied over a range, and it has been found that it is generally preferable to use speeds of from about 10 mm/hr to 500 mm/hr.

The feed rate of the crystal seed is desirably such that the quantity of crystal-forming material fed per unit time is at every instant substantially equal to the speed of withdrawal of the material pulled onto the seed. In the case, for instance, of the preparation of a single crystal of sodium chloride with a rectangular capillary 15 mm by 1 mm, that is, having a cross-sectional area of 15 mm², and a drawing speed of 30 cm/hr, the feed rate, P, ought to be P(g/hr)=30(cm/hr)×15×10⁻²(cm²)×d(g/cm³), d being the specific weight of solid NaCl, 2.16 g/cm³, so that P=9.7 g/hr.

The processes of the present invention enable one, by judicious selection of the shape of the end of the capillary channel, to obtain single crystals of variable thickness or diameter. It is notably possible to obtain single crystals having a thickness of from 10 to 12 mm with capillaries having thicknesses of from 1 to 2 mm.

Figure 2:
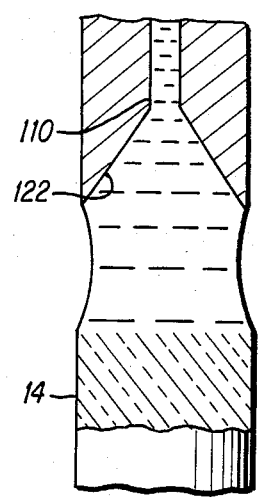
FIG. 2 is a view, partly in section, of the capillary mouth in another embodiment of the invention.

FIGS. 1 and 2 show the influence of the capillary end shape on the thicknesses of the single crystal formed. Referring to FIG. 1, capillary 11 with a tapered mouth 12 as illustrated enables production of single crystal 14 having a thickness substantially equal to the capillary duct dimension. In the case of capillary 110 having inwardly depressed configuration 122 shown in FIG. 2, the single crystal formed has a very much greater thickness than that of the capillary. This is due to the phenomenon of the wetting of the capillary surface by the liquid.

The process of this invention permits preparation of single crystals from a wide variety of different materials. Exemplary of materials which can be used in the present invention are sodium chloride, potassium chloride, pure silicon, doped silicon, plain alumina, doped alumina, yttrium garnets, alumina and magnesia-alumina spinels, and the like.

The present invention also provides novel apparatus for fabricating single crystals according to the processes herein described.

The apparatus according to this invention comprises:
(a) a crucible having in its lower region a capillary aperture with a height greater than or equal to the retention height of the capillary for the molten material serving to prepare the single crystal at the selected operating temperature and pressure,
(b) heating means disposed around the crucible,
(c) feed means for the single crystal-forming material disposed at the top of the crucible,
(d) an enclosure equipped with an apparatus permitting cooling thereof embracing the crucible and the feed means and having a lower opening permitting the passage of the fabricated single crystal, openings allowing the circulation of the gas comprising the working atmosphere, if desired, as well as orifices allowing the pasage of the heating means;
(e) seed-carrying means to hold a preformed single crystal seed;
(f) means for the displacement of the seed carrier means toward and away from the capillary and for rotation of the seed-carrying means about its axis; and
(g) control means linking the pulling speed of the single crystal formed to the feed rate of the material serving to form the single crystal.

Figure 3:
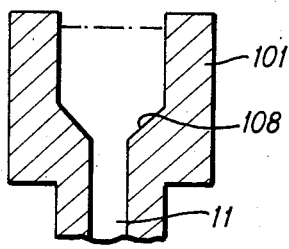
FIG. 3 is a sectional view of the upper portion of one form of capillary according to the invention.
Figure 4:
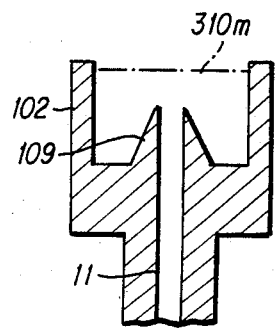
FIG. 4 is a sectional view of the upper portion of another form of capillary used in some embodiments of the invention.

The crucibles can have any appropriate shape. The upper part of the capillary channel can be at various locations in the crucible. FIG. 3 shows a configuration in which the upper end 108 of capillary 11 is located at the bottom of crucible 101, while FIG. 4 shows an embodiment wherein upper extremity 109 of capillary 14 is near the top of the melt level 310 m in crucible 102.

The crucible is fabricated from material chemically inert to and unreactive with the single crystal-forming feed material at the operating temperature. The crucible can for instance be constructed of platinum for the preparation of single crystals of sodium chloride; of sintered silicon carbide, for silicon; of molybdenum, for alumina; or of iridium, for alumina.

The enclosure is made entirely of an appropriate material, for example, of quartz. It can also be metallic. The enclosure in certain embodiments, for example, in the preparation of silicon and alumina single crystals, is desirably cooled. The cooling can be accomplished by any suitable means. Thus, the enclosure can be equipped with a cooling jacket supplied with cooling water.

The cross-section of the capillary can have a shape adapted to the desired shape of the single crystal. Thus, the capillary can be circular for the production of single crystals in the configuration of a thread or filament, and it can be rectangular for producing single crystals in the form of slabs or chips.

The capillary aperture can also consist of a set of cylindrical capillary channels or conduits having an axis parallel to the axis of the crucible and being disposed on a circle centered on the axis of the crucible. With such a device it is possible to produce either a set of wire-shaped monocrystals or a tube, the diameter of the tube being equal to the diameter of said circle. To produce a tube, the distance between two adjoining conduits must be comprised between 2 and 5 times the diameter of a conduit.

The heating means is comprised of appropriate apparatus. Thus, the heating means can be a resistance heater or, in certain embodiments of the invention, preferably a high-frequency induction heater fitted with coils adapted to the shape and material of construction of the crucible. Such an induction heater desirably operates at a frequency of from about 20 to about 500 kHz to assure coupling with the crucible material and developing up to 50 kw.

Figure 5:
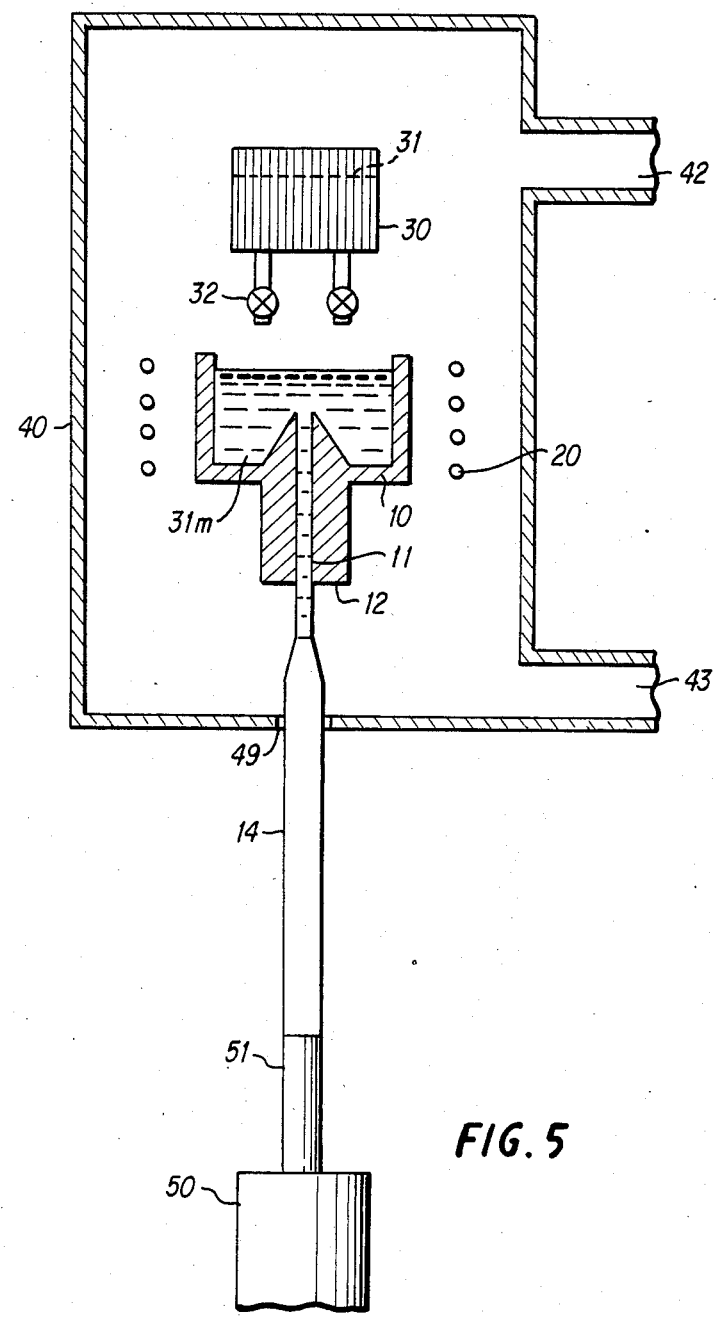
FIG. 5 is a schematic view of one form of apparatus according to the invention.

The invention will further be described by reference to FIG. 5 showing crucible 10, capillary 11, feed material 31 for the single crystal in reservoir 30 with metering gates or valves 32 constituting the feed means, enclosure 40 surrounding the crucible and other elements, with aperture 49 to permit withdrawal of single crystal 14 produced by the process. Seed carrier 50 supports preformed seed crystal 51, and crucible 10 is surrounded by heating means 20. Heating means 20 is represented symbolically by coils which can be radiant heaters or which can carry high-frequency current to provide induction heating. It is noted that while the coils are shown inside enclosure 40, they can equally well be placed externally to the enclosure. Enclosure 40 can be provided with apertures or ducts 42 and 43 to permit sweeping the working volume with gas or to permit drawing a vacuum, or otherwise controlling the pressure and composition of the working atmosphere.

To form a single crystal according to this invention, the crucible is heated to the selected temperature, above the melting point of the single-crystal-forming material, by means of heating apparatus 20. Crucible 10 is then fed with material 31 by means of feed system 32. Material 31 melts down gradually, as it reaches crucible 10, to form molten material 31m which flows to capillary channel 11, so a drop appears at the lower end thereof 12. The drop formed is placed in crystallographic contact with oriented seed 51 for the single crystal to be prepared through displacement of the top of seed carrier 50.

Figure 6:
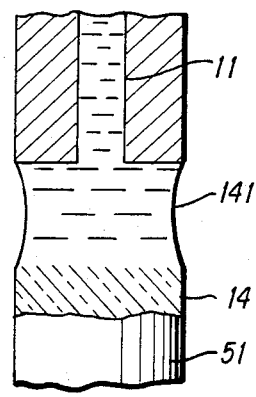
FIGS. 6 and 7 are partial sectional views showing varying surfaces of the crystals being drawn, from the ends of differently shaped capillaries.
Figure 7:
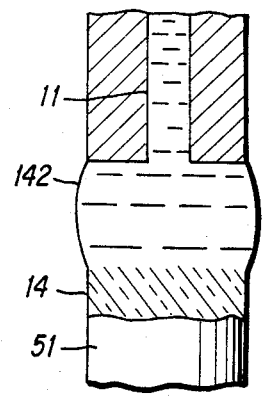

The upper portion of the seed, heated by the liquid drop and by the radiated heat from the melt in the crucible, fuses at its upper surface and assures a continuous bond with the liquid drop, forming thereby a liquid-solid interface at this level where the crystal growth occurs. Once contact is made, an equilibrium system is established by regulating the solid crystal-forming material feed into the liquid zone, so as to obtain shapes varying from concave surfaces 141 in FIG. 6 to convex surfaces 142 in FIG. 7 according to the liquid pressure in the capillary channel and the distance of the top of the seed from the lower extremity of the capillary channel. A very substantial longitudinal temperature gradient (along the drawing axis of the crystal) occurs at the level of the lower end of the capillary channel.

The liquid-solid interface described above lasts throughout the operation at the same level through this gradient. To begin crystalline growth, seed 51 is at first lowered (after contact with the liquid) while feeding the top of the crucible with the material serving to form the single crystal in an amount equal to the solidify liquid. The feed rate is adjusted to the amount of the single crystal formed by means of a regulating system (not shown) relating the pulling speed of carrier 50 to the feed rate of material 31 and thereby controlling valves or gates 32. Continuous and automatic growth of the single crystal is thus obtained, which crystal grows without interruption towards the foot as long as the material feed is maintained and the single crystal formed is drawn toward the bottom.

It will be appreciated from the present description that the present invention offers many important advantages over prior art processes for preparing single crystals. The present processes permit production of single crystals having a pre-selected shape without any machine-finishing or with greatly simplified machining. The process can be performed continuously to provide large crystals.

The crucible has relatively small dimensions, on the order of 20 to 50 $cm^3$. This is a particularly important point because of the high price of the special materials used to fabricate the crucible. The power consumed for heating is very small by comparison to other methods of preparing single crystals. The pulling of the single crystal formed is effectively toward the earth, and this permits the use of a nearly nil force at the level of the growth front.

From the same size capillary orifice, it is possible to obtain single crystals of a variable diameter or thickness, according to the given shape of the capillary end. The method provides, with appropriately oriented seeds, the pulling of single crystals having the same crystalline orientation as the single crystal selected. The working temperature need not be regulated more closely than about $\pm 10°$ C., and this provides a considerable advantage with respect to prior art methods which require regulation to $\pm 0.5°$ C.

Figure 8:
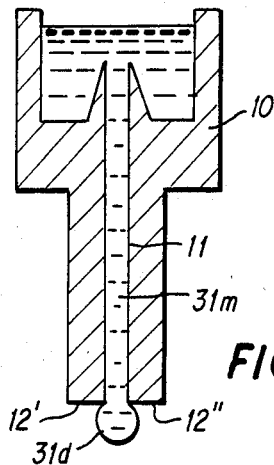
FIG. 8 is a partly sectional view of drop formation in one aspect of the invention.

In the foregoing embodiments, the lips or edges at the lower extremity of the capillary conduit are in the same horizontal plane, as readily seen from FIGS. 1, 2, and 8. FIG. 8 shows a sectional view of crucible 10 provided with capillary 11 through which flows molten material 31m down to lower edges 12' and 12''. Molten material 31m used to form the single crystal forms a pendant drop 31d below edges 12' and 12'' before the oriented seed crystal is contacted with the material issuing from the lower tip of capillary 11. With a capillary tip as shown in FIG. 8, the liquid zone, that is the distance between the bottom of the capillary and the top of the oriented crystal formed is on the order of 0.1 to 0.5 mm. It can be desirable, especially to improve the control and regulation of the delivery of the feed material, as well as to improve control over the quality of the liquid, to use equipment in the aforementioned liquid zone should that be more important.

Thus, particularly for embodiments of the present invention wherein the capillary conduit has a rectangular section, the lower lips or edges of the capillary can be constructed so they are not in the same horizontal plane. Accordingly, in this embodiment of the invention the crucible having in its lower part a capillary orifice with a retangular section and the capillary having a height equal to or greater that the retention height of the molten liquid in the capillary at the given temperature and pressure is constructed with its lower extremity not in the same horizontal plane. It will be understood that the apparatus according to this embodiment of the invention includes the heating means, feed systems, enclosure, carrier means, and control means, as used in the various embodiments hereinbefore and hereinafter disclosed.

Figure 9:
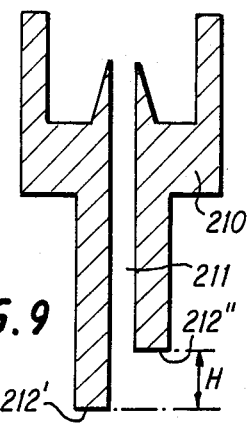
FIG. 9 is a sectional view of a crucible and capillary in another embodiment of the invention.
Figure 10:
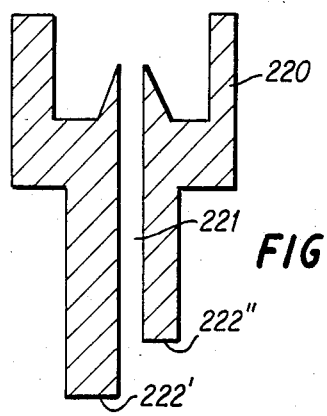
FIG. 10 is a sectional view of a crucible and capillary in a further embodiment of the invention.

In this embodiment of the invention, the lower lips are for example displaced by height, H, of from about one to about three millimeters. This can better be appreciated by reference to FIG. 9 showing crucible 210 and capillary channel 211, with lower lips 212' and 212" displaced vertically from one another by height H. The walls of the capillary extending downwardly from the crucible can also have different thicknesses as illustrated in FIG. 10, where crucible 220 is pierced by capillary 221 having lips 221' and 221". The wall terminated by lip 231' is considerably thicker than the wall terminated by lip 231".

Figure 11A:
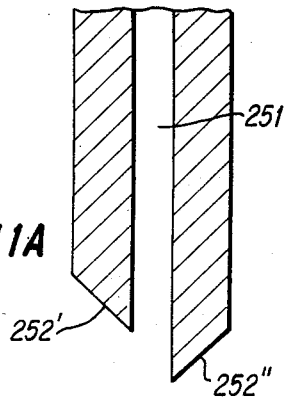
FIGS. 11A and 11B are sectional views of two forms of capillary taps.
Figure 11B:
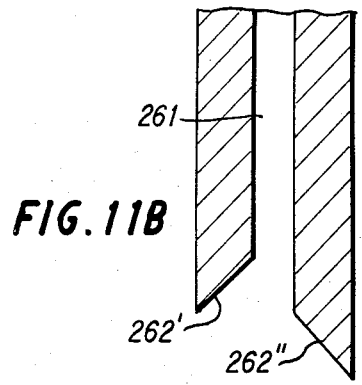

In particular, the longest end can have the greatest thickness, as shown in FIG. 9, in order not to cause too rapid a cooling of the liquid in the pendant drop. As in the case of the capillaries shown in FIGS. 1 and 2, when the lips or ends of the capillaries are not in the same horizontal plane, they can also be beveled as shown in FIGS. 11a and 11b where capillary 251 is terminated by beveled lips 252' and 252" and capillary 261 is terminated by lips 262' and 262".

Figure 12:
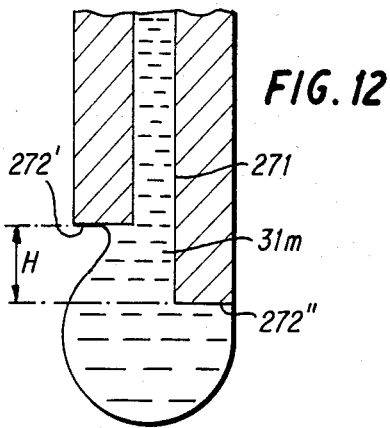
FIG. 12 is a partial sectional view of drop formation in a staggered capillary tip.

With the stepped tip capillaries just described, the drop formed at the lower extremity of the capillary conduit is asymmetric, as shown schematically in FIG. 12 where molten material 31m flows through capillary 271 terminated by lips 272' and 272", their vertical planes differing by height H, to form drop 231. It should be remarked as well that, although the pendant drop is asymmetric, the capillary phenomenon continues to play a controlling role, and there is no dribbling of liquid along the longest lip.

The advantages of the differential height lips have been found to be numerous. In the first place, they provide for better visual inspection of the quality of the liquid, which is made possible by displacement H between the two lips of the capillary orifice, particularly permitting detection of the presence of possible impurities which cause inclusions. For example, there are sometimes bits of the crucible caused by slight corrosive attack of the material thereof. Also, this particular construction provides an opportunity for detecting the presence of microbubbles of gas or volatile material. In other words, this particular construction provides a means for controlling the quality of the liquid and determining the instant when crystallization can be started.

The differential height lips also provide an opportunity to measure, along the entire length of the liquid, the temperature of the horizontal band comprising the crystallization front. This easier inspection of the temperature gradient horizontally on the upper part of the crystallization front permits control of the heating of the chip so as to yield a more homogenous product and to operate at a linear crystallization front, that is, at a plane liquid-solid interface.

A third advantage afforded by the differential height lips is that the easier inspection by optical means affords the possibility of controlling the feed material according to the circumstances of operation. A fourth advantage is the control over the cooling of the liquid which permits operating at higher cooling speeds, for example up to 50% faster, than when the lips are not vertically displaced. Yet another advantage is the exact control of the liquid temperature. This makes it possible because of the height difference between the lower edges of the capillary conduit to operate exactly at the fusion point of the material used to form the single crystal without the danger of supercooling.

When this differential height equipment is used it permits the production of single crystals of sodium chloride, silicon, and alumina, including doped and undoped sapphire. This apparatus is further applicable to all single crystals having the following characteristics: those having a sharp melting point, those wetting the capillary material without chemical attack, those withstanding the atmospheres and pressures necessary to obtain the desired crystalline phase, those passing through the melting point at ambient temperature without going through crystalline phases which risk causing fractures.

If the composition of the feed material remains identical over the course of preparation, a single crystal having the same composition throughout its length is obtained. It is also possible according to the present invention, however, to obtain single crystals having a composition which varies along their length.

The variation of the composition of the single crystal-forming material is obtained, according to an embodiment of this invention, with a multiple feed system comprising two or more reservoirs or containers feeding the crucible simultaneously or serially. In this embodiment, the process involves the step of placing the single crystal-forming material, of which the composition is to be varied in a predetermined and adjustable manner, in a crucible having in its lower portion a capillary conduit with a height equal to or greater than the retention height of the molten material in the capillary at the temperature and pressure utilized.

The steps of melting the material, bringing the seed into contact with the pendant drop, pulling the seed, and removing the monocrystal so formed are carried out as previously taught herein.

The apparatus for carrying out the variable-composition embodiment includes the crucible with the capillary conduit, the heating means, the enclosure, the seed-carrying means, the seed-carrier displacement means, and the control means, as set forth above. The feed means is adapted to be a multiple feed means by placing above the crucible at least two independent feed reservoirs. The multiple feed system permits obtaining at the lower end of the capillary a liquid with a composition which can be varied and controlled at will. It should be noted that the small quantity of molten material in play, namely a few cubic centimeters, permits a sharp change of doping in the crystal produced, corresponding to the change in composition.

This embodiment thus provides for the production of single crystals with variable dopings or different compositions along their length. For instance, a silicon single crystal can be produced with an N-type band along part of its length, and then a P-type, simply by having two reservoirs each of which is simultaneously charged with powdered doped silicon, the one with the P-type, the other with N-type. Equally well, a single crystal which is variably doped along its length can be obtained according to a program laid out in advance.

For example, according to this particular embodiment, a laser ruby can be obtained with chromium doping increased progressively and linearly from the start of the crystallized part all the way up to the selected endpoint by stopping the crystallization. A first feed system for powdered $Al_2O_3$ doped with $Cr_2O_3$ is installed so that there is obtained 200 parts per million (ppm) by weight of Cr with respect to the alumina in the crystal. A second feed system is installed for alumina much more heavily doped with chromia.

During the crystallization, the two feed programs are organized in the following steps:

The operation is started with the first feed. At the start the crystal contains 200 ppm of Cr in the $Al_2O_3$.

Progressively, the second feed is put into operation so that the quantity of chromia is increased linearly. Care is taken that the overall amount of alumina powder charged to the crucible remains constant, that is, that the feed from the first container is diminished to the extent that the feed from the second is increased.

At the end of the crystallization there is obtained a crystal containing, for example, 1000 ppm Cr, based on the $Al_2O_3$.

The same result can be obtained with two feed means, one charged with pure powdered $Al_2O_3$ and the other with $Al_2O_3$ and $Cr_2O_3$. In this case their mixture is appropriately programmed to obtain the desired result.

This just-described embodiment of the invention affords methods and apparatus for obtaining variations in physical and/or chemical properties in the same single crystal. This variation is obtained without a physical junction of any kind, and it has many practical uses, particularly in the field of electronics.

The single crystals prepared according to the present invention find numerous uses. For example, ruby single crystals are useful in jewelry, in watch-making, and in electronics. To obtain a laser effect, single crystals of sapphire, that is, α-alumina, are used as insulating chips to serve as supports for the electronic circuits, and as transparent windows for ultraviolet and near-infrared radiation.

Silicon single crystals prepared according to the invention are used in the electronics industry for their semi-conductor properties, notably for the preparation of transistors and integrated circuits and of photovoltaic cells for harnessing solar energy. The use of single crystal filaments for use as light guides (optical fibers) and as reinforcing fibers for materials such as metals and plastics can also be mentioned. Monocrystalline tubes are used in alkali metal lamps or for transportation of corrosive or biologic liquids.

All parts, percentages, proportions, and ratios herein are by weight, unless otherwise indicated.

The following examples are given to illustrate embodiments of the invention as it is presently preferred to practice it. It will be understood that these examples are illustrative, and the invention is not to be considered as restricted thereto except as indicated in the appended claims.

EXAMPLE I

Preparation of Sodium Chloride Single Crystal

The crucible used is a 20 $cm^3$ platinum crucible pierced in its lower region by a rectangular cross-section capillary of 1 by 15 mm with a length of 10 mm. The crucible is charged with sodium chloride powder having a particle size of 0.1 mm and it is heated in air from that temperature to 825° C. (melting point NaCl=800° C.) by means of a high frequency generator operating at 20 kHz and developing a continuous power of 5 kw.

The temperature is readily maintained at this value ±10° C. throughout the process. In time, a pendant drop forms at the bottom of the capillary and is placed in contact with a sodium chloride flat having a 1 by 15 mm rectangular section to serve as a seed, and the seed is then pulled downward at speed of 30 cm/hr, while at the same time the crucible is fed with sodium chloride powder at an average rate of 9.7 g/hr.

After twenty minutes of pulling, a rectangular slab having a cross-section of about 1 by 15 mm is obtained with a length of about 100 mm. This single crystal has a substantially flat surface and is perfectly transparent. X-ray diffraction analysis shows that it is a single crystal, and it has the crystalline orientation of the seed. Its infrared spectrum corresponds to the purest products available from manufacturers.

EXAMPLE II

Preparation of Silicon Single Crystal

The crucible used is sintered silicon carbide having a total volume of 20 $cm^3$ with a capillary channel having a 1 by 15 mm rectangular cross-section. The crucible and feed system are contained in a quartz enclosure swept with an oxygen-free argon stream. The crucible is charged with a high purity doped silicon powder having a particle size of from 0.1 to 1 mm, and it is brought to a temperature of 1440° C.±10° C. (silicon m.p.=1410° C.) by means of a high frequency generator working at 300 kHz and developing a 10 kw continuous power.

The drop which forms at the lower extremity of the capillary is contacted with an oriented 1 by 15 mm silicon chip which serves as a seed. The drop fuses and adheres to the seed. The seed is then pulled down at a speed of 50 cm/hr and at the same time the crucible is fed at an average rate of 10 g/hr with powdered silicon.

After twenty minutes of pulling, a silicon slab having a section of about 1 by 15 mm and a length of 150 mm is obtained with a relatively flat surface. Examination by X-ray diffraction shows that the plate appears to be a single crystal with a tiny amount of particulate matter and a crystallographic orientation identical to that of the seed.

EXAMPLE III

Preparation of Sapphire (α-Alumina) Single Crystal

The crucible used is iridium with a total volume of 20 $cm^3$ tapped in its lower region with a capillary having a 1 by 15 mm rectangular section. The crucible is enclosed in a chamber swept with an oxygen-free argon stream, and is charged with monocrystalline alumina beads having a diameter of 0.05 to 0.1 mm.

The crucible is brought to a temperature of 2075° C.±10° C. (α-alumina m.p.=2050° C.) with the aid of a high frequency generator operating at 20 kHz and having a continuous power output of 30 kw. At the time a pendant drop forms at the bottom of the capillary channel, it is contacted with a thin plate of a single sapphire crystal of selected orientation with dimensions of 1 by 15 mm to serve as the seed. When the drop welds to the seed, the seed is pulled down at a speed of 30 mm/hr.

At the same time, the crucible is fed with alumina at a mean rate of 18 g/hr. After twenty minutes of pulling, a thin slab of sapphire is obtained having a rectangular section of about 1 by 15 mm and about 100 mm long, transparent and having a relatively plane surface.

By X-ray diffraction examination, the plate appears to be a single crystal and it has the crystallographic orientation of the seed. By optical examination, the slab has the spectral absorption of sapphire and shows a few bubbles distributed at random.

EXAMPLE IV

Preparation of Single Crystal Filament of Salt

The crucible used has a volume of 20 cm$^3$ and is tapped at the bottom with a circular capillary having a diameter of 0.5 mm and a length of 5 mm. The crucible is fed with sodium chloride powder having a particle size of 0.1 mm and it is heated in air at the same time to a temperature of 825° C. with a high frequency generator operating at 20 kHz and developing 5 kw continuous power. During the crystal-growing operation, the temperature is maintained at the desired value within ±10° C.

In time a hanging drop forms and it is contacted with a small stalk of sodium chloride having a diameter of 0.5 mm to serve as a seed. The seed is lowered at a speed of 30 mm/hr and at the same time the crucible is fed with sodium chloride powder at the rate of 0.4 g/hr. After twenty minutes of pulling, a filament is obtained with a circular cross-section of about 0.5 mm in diameter and a length in the neighborhood of 100 mm.

The single crystal filament so formed is transparent. X-ray diffraction examination shows that the filament appears as a single crystal and it preserves the crystalline orientation of the seed. The infrared spectrum corresponds to the purest products which can be made.

EXAMPLE V

Preparation of a Tube of Sapphire

The crucible used is a 20 cm$^3$ molybdenum crucible pierced in its lower region by circular capillaries having a diameter of 0.5 mm. The circular capillaries are disposed on a circle having a diameter of 10 mm. The distance between two adjoining capillaries is 1.5 mm.

The crucible is placed in an enclosure swept with an oxygen-free argon stream.

The crucible is charged with monocrystalline alumina beads having a diameter of 0.05 to 0.1 mm.

The crucible is brought to a temperature of 2075° C.±10° C. (α-alumina m.p.=2050° C.) with the aid of a high frequency generator operating at 20 kHz and having a continuous power output of 30 kw.

The drops at the lower extremity of each conduit form a liquid ring which is contacted with a tube of sapphire having an internal diameter of 9 mm and an external diameter of 11 mm.

When the ring welds to the seed, the seed is pulled down at a speed of 30 cm/hr.

At the same time, the crucible is fed alumina at a mean rate of 135 g/hr. After twenty minutes of pulling, a transparent tube is obtained having a length of 100 mm and a mean internal diameter of 11 mm.

By X-ray diffraction examination, the tube appears to be monocrystalline with crystallographic orientation identical to that of the seed.

The tube has the spectral absorption of sapphire and shows a few bubbles distributed at random.

EXAMPLE VI

Preparation of Silicon Single Crystal Chips

The crucible used is a sintered silicon carbide vessel having a total volume of 20 cm$^3$ with a one by fifteen millimeter rectangular cross-section capillary conduit upon which one of the lips is 2 mm lower than the other. The crucible and a feed system are enclosed in a quartz container swept by an oxygen-free argon current.

The crucible is fed with high-purity doped silicon having particles in the range of from about 0.1 to about 1 mm, and the crucible and its contents are brought to a temperature of 1500° C.±10° C. (silicon melting point being 1470° C.) through the use of 300 kHz high-frequency generator operated at a steady power of 10 kw. The crucible is fed with powdered silicon at a mean speed of 28.5 g/hr. The drop formed at the bottom of the capillary channel is allowed to cool at the bottom of the capillary until inspection of the liquid shows that this has no apparent impurities. At this time the drop formed is brought into contact with a 1 by 15 mm silicon chip having the proper crystalline orientation to act as the seed, and the drop is adhered to the seed.

The seed is then pulled down at a speed of 75 cm/hr and at the same time the crucible is continuously fed with powdered silicon at a mean rate of 28.5 g/hr. After 20 minutes of pulling, a silicon chip is obtained with a cross section of about 1 by 15 mm and a length of about 225 mm, the chip having a relatively plane surface. X-ray diffraction examination shows that the chip is a single crystal with a tiny amount of particulate matter and a crystallographic orientation identical with that of the seed.

EXAMPLE VII

Preparation of a Monocrystal of Sapphire and Ruby

The iridium crucible used has a total volume of 20 cm$^3$ and is tapped in its lower portion with a capillary having a 1 by 15 mm rectangular section, and is placed in an enclosure swept with a current of oxygen-free argon. Through use of a first feed reservoir, the crucible is fed with pure alumina monocrystalline spheres having a diameter of 0.05 to 0.1 mm or with pure alumina particles with a diameter of 5 to 50 microns.

The crucible is brought to a temperature of 2075°±10° C. (the melting point of alpha-alumina being 2050° C.) with a high frequency generator operating at 20 kHz and a continuous power of 20 kw. Once the drop forms at the lower end of the capillary, there is placed in contact with it a previously oriented 1 by 15 mm thin monocrystalline chip as a seed. Once the drop from the capillary adheres to the seed chip, the chip is drawn down at a speed of 30 cm/hr. Simultaneously alumina is fed to the crucible at the rate of 18 g/hr. After ten minutes' pulling, a thin sapphire plate with about a 1 by 15 mm section and a 50 mm length is obtained.

At this very moment, the pure alumina feed is stopped and the crucible is fed from a second supply reservoir containing powdered alpha-alumina doped with 500 parts of chromium per million parts of alumina. The pulling is continued at the same rate and after 10 more minutes the total length of the chip is about 100 mm. This chip is monocrystalline and transparent, with a colorless first part and a rose-colored second part. There is a separation zone between the two parts of a few millimeters where the color changes progressively from colorless to rose.

EXAMPLE VIII

Preparation of P- and N-Type Silicon Single Crystal

A sintered silicon carbide crucible, having a total volume of 20 cm$^3$ and a 1 by 15 mm rectangular capillary in its bottom, is provided with a feed system and placed in a quartz enclosure swept with a stream of oxygen-free argon. The crucible is charged with high-purity, boron-doped silicon powder having a particle size of 0.1 to 1.0 mm and the temperature is brought to 1500°±10° C. (the melting point of the silicon being 1470° C.) by a radio-frequency generator operating at 300 kHz developing 10 kw continuous power.

The drop of molten silicon which forms at the lower end of the capillary is brought into contact with an oriented 1 by 15 mm seed, and the drop fuses to the seed. The seed is then pulled down at a speed of 50 cm/hr and simultaneously the crucible is fed powdered silicon at the rate of 19 g/hr. After 10 minutes of pulling, a 1 by 15 mm silicon chip with a length of about 75 mm is obtained.

At this very time, the feed of boron-doped silicon to the crucible is interrupted and simultaneously the crucible is fed from a second feed reservoir containing powdered silicon doped with phorphorus. The pulling of the chip is continued for another ten minutes at the same speed, and the chip attains a total length of about 150 mm. The resulting chip is a single crystal having a first part doped with boron (P-type) and a second part doped with phosphorus (N-type). The separation zone between the two parts is a few millimeters thick where the composition changes from boron doping to phosphorus doping.

What is claimed is:

1. A continuous process for the preparation of single crystals having a predetermined shape, which process comprises:
    (a) charging the crystal-forming material to a crucible tapped in its lower region by a capillary conduit with a height greater than or equal to the retention height of the melted crystal-forming material in the capillary at the temperature and pressure used,
    (b) bringing th crystal-forming material to a temperature above its melting point so as to form a drop at the lower end of the capillary,
    (c) contacting a preformed seed crystal having a selected crystal orientation with the drop, and
    (d) pulling the seed crystal in contact with the drop downwardly away from the crucible to form a single crystal, at a growth front between the crystal and the melted crystal-forming material, the quantity of crystal-forming material fed per unit of time being substantially equal to the amount of material pulled into the single crystal and the force at the growth front being substantially nil.

2. A process according to claim 1 wherein the crystal formed is periodically removed at selected time intervals.

3. A process according to claim 1 wherein the crystal-forming material is sodium chloride, potassium chloride, pure or doped silicon, undoped alumina, doped alumina, yttrium garnet, or alumina or alumina-magnesia spinels.

4. A process according to claim 1 wherein the crystal-forming material is in the form of beads.

5. A process according to claim 1 wherein the crystal-forming material is in the form of grains.

6. A process according to claim 1 wherein the crystal-forming material is a powder.

7. A process according to claim 1 carried out under an inert atmosphere.

8. A process according to claim 1 carried out under vacuum.

9. A process according to claim 1 where the quantity fed is controlled to obtain a single crystal with substantially plane surfaces.

10. A process according to claim 1 wherein at least two different crystal-forming materials are charged to the crucible.

11. A process according to claim 1 wherein at least two different crystal-forming materials are charged to the crucible serially.

12. A process according to claim 1 wherein at least two different crystal-forming materials are charged to the crucible in amounts which are varied over a period of time.

13. A process according to claim 1 wherein the material is brought to a temperature above its melting point by radio frequency induction heating.

14. A process according to claim 1 wherein the speed of downward movement is from about 10 to about 500 mm/hr.

15. A process according to claim 1 wherein at least one of the lower edges of the capillary is in a different horizontal plane than the other edges.

16. A process according to claim 15 wherein H is from about one to about three millimeters.

17. A process according to claim 1 wherein the crucible contains a few cubic centimeters of crystal-forming material.

* * * * *